US005498973A

United States Patent [19]
Cavaliere et al.

[11] Patent Number: 5,498,973
[45] Date of Patent: Mar. 12, 1996

[54] APPARATUS FOR TESTING SEMICONDUCTOR LASER DEVICES

[75] Inventors: William A. Cavaliere, Verbank, N.Y.; John S. Ferrario, Waterbury, Vt.; Howard E. Ferris, Wappingers Falls, N.Y.; Raymond C. Schuler, South Burlington, Vt.; Ronald L. Strijek, Wappingers Falls, N.Y.

[73] Assignee: International Business Machines Corporation, Armonk, N.Y.

[21] Appl. No.: 362,682

[22] Filed: Dec. 22, 1994

[51] Int. Cl.$^6$ .............................. G01B 9/02; G01R 31/02
[52] U.S. Cl. ............................................. 324/765; 356/239
[58] Field of Search ......................... 324/765; 356/239; 250/214; 340/172.5; 73/800

[56] References Cited

U.S. PATENT DOCUMENTS

| | | | |
|---|---|---|---|
| 3,949,295 | 4/1976 | Moorshead | 324/158 F |
| 4,489,477 | 12/1984 | Chik et al. | 29/569 L |
| 4,571,077 | 2/1986 | Skeldon | 356/239 |

FOREIGN PATENT DOCUMENTS 0266239  10/1990  Japan .

*Primary Examiner*—Kenneth A. Wieder
*Assistant Examiner*—Barry C. Bowsel
*Attorney, Agent, or Firm*—Aziz M. Ahsan; Michael J. Balconi-Lamica

[57] ABSTRACT

An apparatus for testing individual ones of semiconductor laser devices of a laser bar during a manufacturing thereof comprises a laser bar chuck for securing the laser bar in a first manner and orientation. A probe is used for probing a laser device of the laser bar. A translational manipulator receives the laser bar chuck and the probe in a second and third manner and orientation, respectively, the manipulator further for translationally positioning the laser bar chuck and the probe independently in a fourth and fifth controlled manner. An energizing means energizes the probe in a sixth controlled manner. A detector detects a lasing of a probed laser device and provides a characteristic output signal representative of a testing characteristic of the probed laser device. Lastly, a controller controls the manipulator and the energizing means in a prescribed manner: (i) in preparation for a testing of a desired one of the laser devices of the laser bar; (ii) during a testing of a desired one of the laser devices of the laser bar; and (iii) upon a completion of the testing of the desired one of the laser devices.

29 Claims, 5 Drawing Sheets

APPARATUS FOR TESTING SEMICONDUCTOR LASER DEVICES

BACKGROUND OF THE INVENTION

1. Field of the Invention

This invention generally relates to an apparatus for testing of semiconductor laser devices, and more particularly, to an apparatus for testing of semiconductor laser devices during the manufacturing thereof and at a point in time at which the laser devices first become functional, prior to packaging of the same.

2. Discussion of the Related Art

In the manufacturing of semiconductor laser devices, the primary steps include: growing and processing double heterostructures on a substrate by, for example, liquid phase epitaxy; cleaving the processed wafer into bars containing many laser diodes (hereinafter referred to as "laser bars"); coating the two exposed cleaved facets of each laser bar with a protective coating; cleaving individual laser diode chips from the laser bars; bonding electrical leads to the chips; and packaging the chips. The laser bar is the first form at which a laser device is fully functional. The laser bar consists of a number of laser devices, from a few devices to many devices. The laser bar is usually cleaved into separate laser devices or it may be used as an array. The laser bar may further be comprised of pairs of laser devices.

Upon cleaving of the laser devices from the laser bar, packaging of the individual laser devices or diodes is one of the most expensive components of laser device production. Determination of whether or not a laser diode is functional has typically been determined or tested after the laser diode has been packaged. Therefore, packaging of a defective or non-functional laser diode is an expensive proposition, particularly in light of high volume manufacturing. It would be highly desirable to test the laser diodes or devices to determine their functionality and/or operability prior to the packaging of the same. Upon such a determination of the non-functioning of a particular laser diode, the non-functional laser diode could be identified and/or discarded prior to packaging of the same to avoid unnecessary packaging.

In Japanese Patent Application No. JP 2-266239, published Oct. 31, 1990, a semiconductor laser inspecting device is disclosed. In the inspecting device, a solid-state image pickup element is used for inspecting light beams from plural light emitting points of a chip to be measured. Probes are used for injecting current into the light emitting elements of the chip. An integral intensity of image pickup patterns are obtained and a arithmetic operation is performed. Thereafter, a prescribed operating current and an oscillation threshold current can be obtained for the chip. The JP 2-266239 device suffers, however, in that it is not well suited for high volume testing in a high volume manufacturing environment. More particularly, the JP 2-266239 device provides no suitable alignment of individual laser bars with respect to the probes nor with respect to the detector, for volume testing purposes. Alignment errors associated with manual loading can lead to unwanted reflections, which further introduces errors and leads to faulty and/or complicated measurements. Contamination problems can also arise with the JP 2-266239 device in that dirt and/or debris can accumulate undesirably between the guiding surface of the test platform and the devices under test, such an area not subject to being easily cleaned. The JP 2-266239 device further suffers from an inability to test multiple characteristics of the devices under test. Still further, the JP 2-266239 device is inadequate for minimizing a handling of the devices under test, thereby subjecting such devices under test to increased probability of being damaged and further adversely affecting testing yield. The JP 2-266239 device is not well suited nor is it easily adaptable for use as a high throughput, high yield device.

In U.S. Pat. No. 4,489,477, a device for screening laser diodes, and in particular, for multiple die burn in, is disclosed. The '477 device includes a row of probes for contacting with and feeding current though to the devices under test. The '477 device suffers from alignment, loading and handling problems which are similar to those as discussed above with respect to the JP 2-266239 device and further in conjunction with high volume testing. For instance, the devices under test of the '477 device rest upon a gold plated heatsink and are not securely held in place, thus alignment of the devices, probes, and detector with respect to one another is not highly repeatable, as is necessary and required for high volume testing. The '477 device is further not well suited for performing a multiplicity of tests upon the devices under test. The '477 device is not suitable nor is it easily adaptable for use as a high throughput, high yield testing device.

It would thus be desirable to provide an apparatus for testing laser devices in a form at which they first become functional, thereby determining the functionality thereof and to facilitate and substantially eliminate unnecessary packaging of non-functional devices. It is further highly desirable to minimize detrimental handling, thus reducing probability for damage and contamination, of laser bars during a testing thereof. Providing an ability for performing a multiplicity of tests upon each laser device, while minimizing a handling thereof, is further highly desirable.

SUMMARY OF THE INVENTION

An object of the present invention is to provide a high throughput, high yield laser bar testing apparatus for determining the functionality of individual ones of laser devices of a laser bar prior to a packaging of the laser devices, such a laser bar testing apparatus for overcoming problems in the art as discussed above.

According to the present invention, an apparatus for testing individual ones of semiconductor laser devices of a laser bar during a manufacturing thereof, the semiconductor laser devices being in a form at a laser bar level, comprises a means for securing the laser bar in a first manner and orientation. The laser bar securing means comprises a laser bar chuck having (i) a base member and (ii) an upper portion member, the upper portion member having an uppermost surface and a front facet alignment reference surface. The uppermost surface of the upper portion member constitutes a laser bar receiving surface. The front facet alignment reference surface is perpendicular to the laser bar receiving surface and provides a reference surface for use in the alignment of a front facet surface of the laser bar therewith. The upper portion member is further characterized by a vacuum port for securing the laser bar to the receiving surface upon application of a vacuum source at the vacuum port. A probing means is provided for probing a laser device of the laser bar. A receiving means is provided for receiving the laser bar securing means and the probing means in a second and third manner and orientation, respectively. The receiving means is characterized by a lateral (X-axis, Z-axis) frame of reference. The receiving means further comprises means for translationally positioning the laser bar securing means and the probing means independently in a fourth and fifth controlled manner along respective (X, Z) axes. An energizing means energizes the probing means in a sixth controlled manner. A detecting means detects a lasing of a probed laser device, the detecting means providing a characteristic output signal representative of a testing characteristic of the probed laser device. Lastly, a controlling means controls the receiving means and the energizing means in the following manner: (i) in preparation for a testing of a desired one of the laser devices of the laser bar, controlling the receiving means to translate the securing means along the X-axis to an X-axis position for X-axis alignment of the desired one of the laser devices with the probing means; (ii) during a testing of a desired one of the laser devices of the laser bar, (ii$_1$) controlling the receiving means to translate the probing means along the Z-axis from a non-contact Z-axis position to a probing contact Z-axis position to thereby probe and electrically contact the corresponding desired one of the laser devices, (ii$_2$) controlling the energizing means to energize the probing means, wherein the probed laser device is caused to lase, and (ii$_3$) monitor and store the characteristic output signal from the detecting means; and (iii) upon a completion of the testing of the desired one of the laser devices, controlling the receiving means to translate the probing means along the Z-axis from the probing contact Z-axis position to the non-contact Z-axis position.

BRIEF DESCRIPTION OF THE DRAWINGS

The foregoing and other teachings and advantages of the present invention will become more apparent upon a detailed description of the best mode for carrying out the invention as rendered below. In the description to follow, reference will be made to the accompanying drawings in which like reference numerals are carried forward, and in which.

DETAILED DESCRIPTION OF THE PREFERRED EMBODIMENTS

Figure 1:
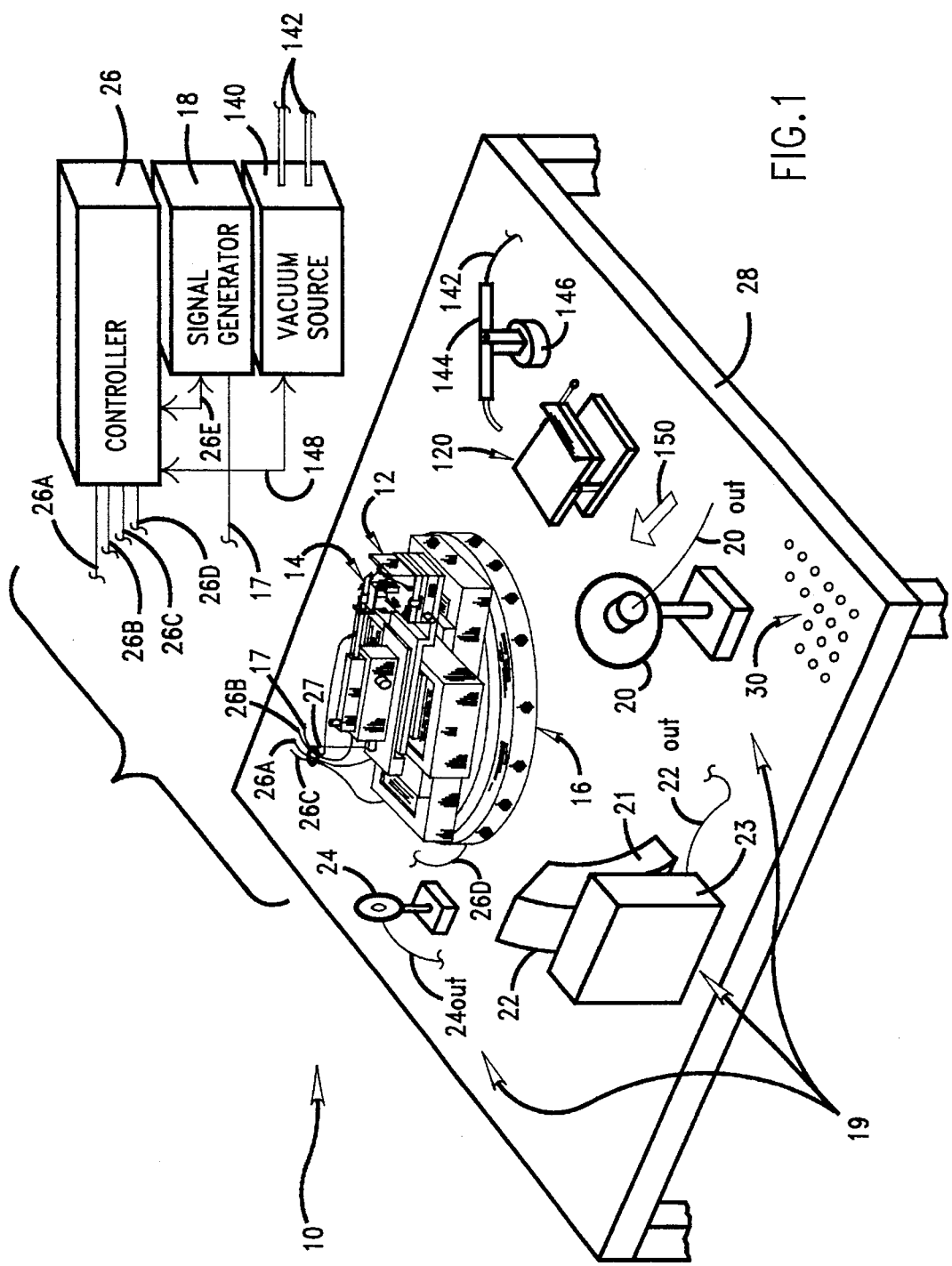
FIG. 1 shows an overall schematic plan view of the apparatus according to the present invention.

Referring now to FIG. 1, the laser bar tester apparatus according to the present invention is generally referred to by reference numeral 10. Apparatus 10 comprises a laser bar securing means 12 for releasably securing one or more laser bars to a top surface thereof in a first manner and orientation. A probing means 14 provides for probing of a laser device of the laser bar, the laser bar being in the first manner and orientation upon securing means 12. A receiving means 16 receives the laser bar securing means 12 in a second manner and orientation. In addition the receiving means 16 receives the probing means 14 in a third manner and orientation. The receiving means 16 is characterized by a lateral (X-axis, Z-axis) frame of reference (See FIG. 4), and provides translational positioning of the laser bar securing means 12 and the probing means 14 in fourth and fifth controlled manners along respective X and Z axes. Referring again to FIG. 1, an energizing means 18 is provided for energizing the probing means 14 in a controlled manner during a testing of a desired one of the laser devices of the laser bar. During a testing of a laser diode, at least one of detectors 20, 22, and 24 are provided for detecting the lasing of the probed laser device and for providing a respective output signal representative of a testing characteristic of the probed laser device. In addition, a control means 26 is provided for controlling the operability of the laser bar testing apparatus 10, as will be further discussed below.

Referring still to FIG. 1, receiving means 16 is mounted upon a table 28 by suitable fastener means (not shown). Table 28 may comprise an optical table or other suitable vibration eliminating table, for example, as is available from Technical Manufacturing Corporation of Peabody, Mass. The table is used for substantially isolating and/or eliminating unwanted vibrations. Elimination of unwanted or undesirable vibrations during a measurement operation is critical to the obtaining of accurate testing measurements. Table 28 is typically provided with a grid array of threaded holes 30 on a top surface thereof to facilitate accurate positioning and fastening of various components thereon. During operation of laser bar tester apparatus 10, a protective safety hood (not shown) is used as appropriate over apparatus 10 for maintaining stray laser light within the safety hood. Such a hood is preferably used when apparatus 10 is used in a high volume manufacturing environment. In addition, special laser light safety glasses should be worn by equipment operators, as required, for safety reasons.

Figure 2:
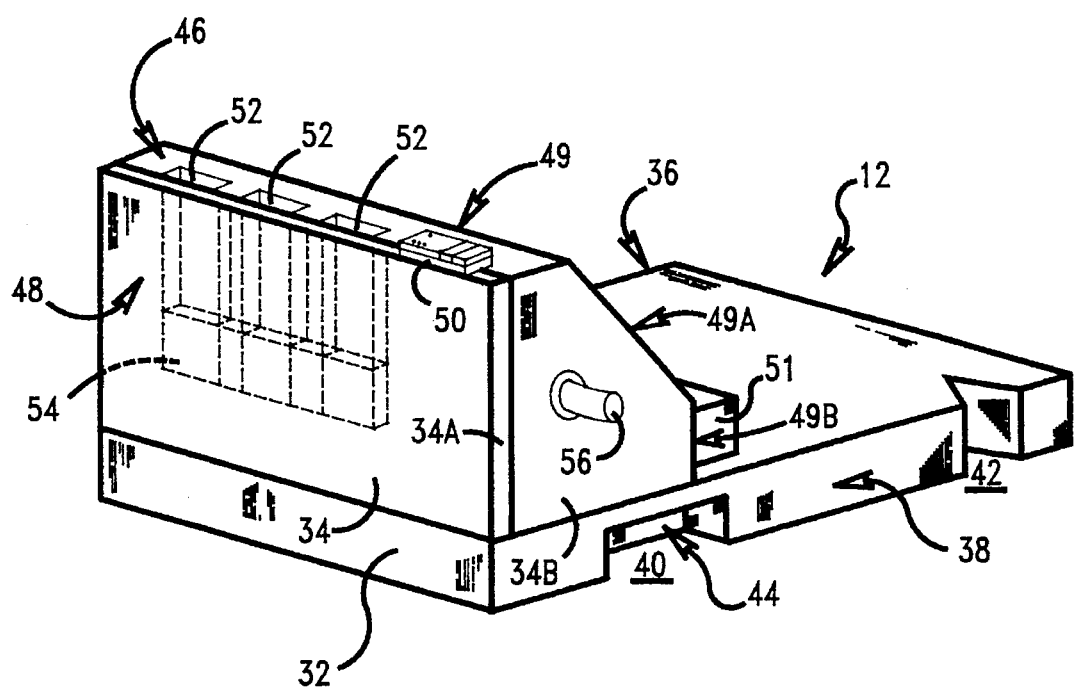
FIG. 2 shows a schematic plan view of the laser bar chuck of the apparatus according to the present invention.

Referring now to FIG. 2, laser bar securing means 12 is shown in greater detail and comprises a laser bar chuck. More particularly, the laser bar chuck comprises a base member 32 and an upper portion member 34. Base member 32 is comprised of a suitably dimensioned block of material having substantially parallel top and bottom surfaces. Base member 32 is further characterized by a first thermal conductivity. The first thermal conductivity is preferably thermally insulative, such first thermal conductivity for facilitating an improved controllability of the temperature of the upper portion member 34, as will be discussed further below. Such a thermally insulative material may comprise, for example, a polyimide.

Referring still to FIG. 2, base member 32 is further characterized by four side edges, wherein one side edge 36 is a reference side edge and an opposite side edge 38 includes a notch 40 and a V-groove 42. Notch 40 includes a surface 44 thereof which is parallel to the respective side edge 38. Notch 40 defines and provides a rotational constraint, as will be explained further herein below. V-groove 42 is spaced from notch 40 and defines and provides a first translational constraint, as will be explained further herein below.

Upper portion member 34 of laser bar chuck 12 (FIG. 2) is characterized by an uppermost surface 46 and a front facet alignment reference surface 48. The uppermost surface 46 constitutes a laser bar receiving surface, that is, a surface for receiving one or more laser bars thereon, as appropriate for a particular testing requirement, in a first manner and orientation. The front facet alignment reference surface 48 is perpendicular to the laser bar receiving surface 46 and provides a reference surface for use in the alignment of a front facet surface of the laser bar 50 therewith, as will be further explained herein below. The width of receiving surface 46 is nominally on the order of twice the width of a laser bar, thereby providing a determinable amount of surface behind a rear facet of a laser bar when the laser bar front facet is aligned with the front facet alignment surface 48. As will be understood better upon reading through the operation of apparatus 10 below, having a repeatable known amount of surface behind the rear facet of the laser bar mounted upon surface 46 in the first manner and orientation will enable a determinable amount of signal error to be compensated for during the detection of laser light emitted from the rear facet. Thus, any error or noise in the signal detection can be minimized and/or appropriately compensated for.

Upper portion member 34 further includes a rear facet surface 49 which includes a sloped upper surface portion $49_a$ and a substantially vertical lower surface portion $49_b$. Sloped surface $49_a$ is at a prescribed angle for assisting in minimizing any unwanted rear facet laser light reflections. That is, any reflections are kept from being directed back to the laser device, and furthermore, reflections which may occur are directed below the laser device to avoid undesirable interference. In addition, exposed external surfaces of the laser bar chuck 12, and to include all other exposed surfaces of apparatus 10, preferably have a matt black or non-reflective finish applied thereto.

Referring still to FIG. 2, upper portion member 34 is further characterized as comprising a material having a second thermal conductivity, the second thermal conductivity being substantially greater than the first thermal conductivity. Upper portion member 34 preferably comprises gold plated brass, for example. Attached to the vertical lower surface portion $49_b$ of rear facet surface 49 is a suitable thermoelectric temperature control element 51. Element 51 is attached to vertical lower surface portion $49_b$ by any suitable means for providing good thermal conductivity. Such thermal conductivity may be further improved upon by embedding a thermally conductive oxide within the upper portion member 34 for thermal connection with element 51. Thermoelectric temperature control element 51 provides for a desired heating of upper portion member 34 and may comprise one or more suitably dimensioned elements, as necessary to provide a desired temperature control for a particular testing requirement (i.e., for maintaining the laser bars under test at a desired temperature and/or for enabling a controlled temperature stressing of the laser diodes of the laser bars during a testing thereof). Still further, a suitable temperature sensor (not shown) may be included proximate to control element 51 and in thermal connection with upper portion member 34 for providing temperature feedback information, as appropriate.

Upper portion member 34 of laser bar chuck 12 (FIG. 2) is still further characterized by at least one vacuum port 52 for securing each laser bar to the receiving surface 46 upon application of a vacuum source at the vacuum port. As shown in FIG. 2, receiving surface 46 of upper portion member 34 can receive four laser bars and correspondingly includes four vacuum ports 52, one of which is hidden from view by the laser bar 50. A vacuum cavity 54 is included within the upper portion member 34 for providing appropriate vacuum porting to the respective vacuum ports 52. An appropriate vacuum coupling 56 is provided in a side edge of upper portion member 34 for connection with a suitable flexible vacuum line (not shown), as will be further explained herein below. The vacuum cavity and vacuum port features of upper portion member 34 may be machined using suitable well known machining practices, for example, by electro discharge machining. In addition, upper portion member 34 may comprise a front portion $34_a$ and a rear portion $34_b$, wherein rear portion $34_b$ includes the machined vacuum port and vacuum cavity features.

Figure 3:
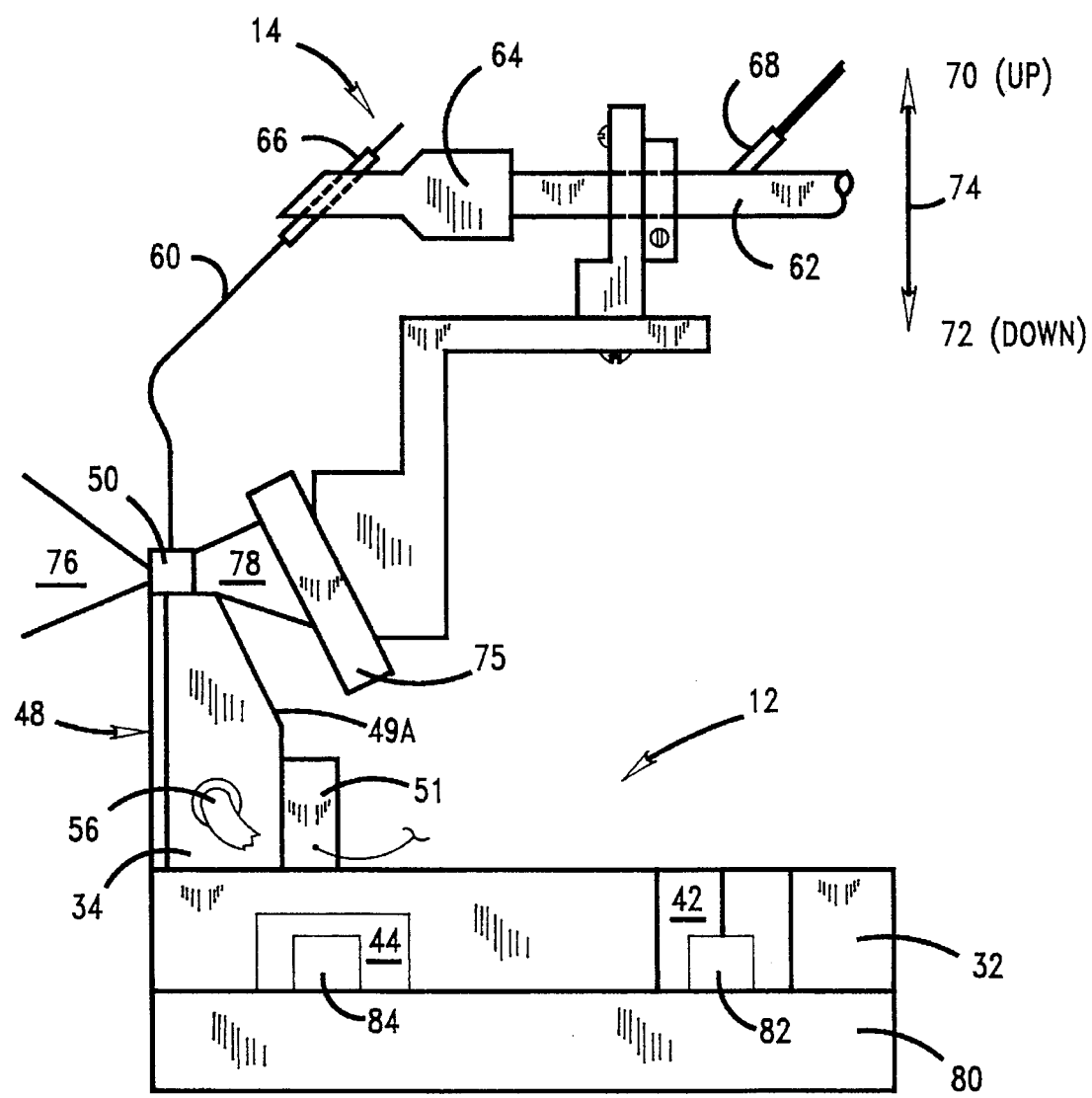
FIG. 3 shows a schematic plan view of the probe of the apparatus, in conjunction with the laser bar chuck and a rear facet lasing detector, according to the present invention.

Turning now to FIG. 3, probing means 14 is shown in probing contact with a desired one of the laser devices of laser bar 50. Laser bar 50 is shown being securably held upon securing means 12 in the first manner and orientation, i.e., the front facet of laser bar 50 is in alignment with front facet alignment surface 48, laser bar 50 further being held in place by suitable application of vacuum applied to the corresponding vacuum port. Probing means 14 comprises a suitable flexible probe needle 60, and more preferably comprises a beryllium copper probe needle. Probe needle 60 is conditioned in a controlled manner so as to provide a probing tip contact area on the order of 40 to 100 square microns and further to facilitate probing in a uniform fashion. Conditioning of probe needle 60 involves (i) manually bending probe needle into a prescribed shape (similar as shown in FIG. 3) to facilitate a desired flexing of the probe needle; and (ii) upon insertion into the end of probing shaft 62, conditioning the probe tip by lowering and raising the probe needle 60 down and up, respectively, with a prescribed force upon a silicon substrate (not shown) for conditioning the probe tip to flex the surface of the silicon (or other suitable substrate) and not to scratch the surface of the silicon (or other substrate). Such conditioning assists in the prevention of damage to individual laser devices of the laser bar(s) during testing of the same.

In addition to the probe needle conditioning, upon an initial set-up of the probing means 14, and in particular, the probe needle 60, receiving means 16 is suitably controlled by control means 26 for lowering probing means 14, and thus probe needle 60, to a point at which probe needle 60 just touches or makes contact with the top of laser bar 50. Such a "just touching" condition can be visually verified and then suitably registered by control means 26 for use thereof during a testing operation. More particularly, when probing during a testing operation, control means 26 controls receiving means 16 to drive probing means 14 in the downward Z-axis direction by a predetermined amount beyond the "just touching" condition. The predetermined amount that probing means 14 is overdriven correlates to a desired force applied or exerted by probe needle 60 upon the probed laser device. In this manner, consistent and accurate probing of the laser devices is advantageously achieved and maintained. Probing means 14 thus has a desired spring force characteristic, suitable for a particular laser bar testing requirement, such that when the probing contact tip thereof is in physical contact with a prescribed laser device, a surface indention occurs on a top surface of the prescribed laser device. No scratching of the top surface of the laser device occurs, thereby advantageously reducing the probability for damage to the laser device during a testing thereof. Probing of a laser device of the laser bar will be further discussed below with respect to the operation of the present invention.

Referring still to FIG. 3, probe shaft 62 can comprise any suitable light weight shaft, such as aluminum. A light weight insulative cap 64 is provided at a probing end of shaft 62 for receiving a suitable electrical connecting sleeve 66, the electrical connecting sleeve 66 for making suitable electrical connection with probe needle 60. An appropriate electrical wire (not shown) is connected to sleeve 66 and routed inside shaft 62 and through wiring harness 68 for further routing and suitable electrical connection with energizing means 18. An end of shaft 62, opposite of the probing end, is suitably connected to receiving means 16 (as will be discussed further herein below), for movement of probing means 14 between a non-contact position 70 and a probing contact position 72 as shown by arrow 74.

Referring still to FIG. 3, a rear facet detector 75 is suitably attached to probe shaft 62, such that, the rear facet detector 75 is oriented for detecting a lasing of a probed laser device of laser bar 50 from a rear facet thereof. When energized, the probed laser device produces a front facet laser light emission (as indicated by numeral 76) and a rear facet laser light emission (as indicated by numeral 78). Such a rear facet detector 75, may comprise, any suitable well known lasing detector, such as a photodetector or an integrating sphere. Rear facet detector 75 further includes an output signal line (not shown) for providing an output signal thereon representative of a testing characteristic of the probed laser device as detected by the rear facet detector 75. Such an output signal line is preferably connected to controller 26 for controller 26 to receive and utilize such output signal of rear facet detector 75 as necessary for a particular laser bar testing application.

Referring still again to FIG. 3, securing means 12 is shown in a secured position upon a securing platform 80 of receiving means 16. Platform 80 includes first and second alignment pins 82 and 84, for engagement with V-groove 42 and surface 44 of notch 40, respectively, of base member 32 of securing means 12. Alignment pins 82 and 84 provide two of three constraints placed upon securing means 12 when securing means 12 is received by receiving means 16 upon platform 80. The third constraint placed upon securing means 12 is provided by a securing clip 86 or suitable fastener (see FIG. 4), which is placed in securing contact with reference side edge 36 of securing means 12. Taken together, the alignment pins 82 and 84, in conjunction with the clip 86 exactly constrain securing means 12 upon receiving means 16 in a controlled manner and orientation. That is, the alignment pins 82 and 84 provide for a first translational constraint and a rotational constraint, respectively, and clip 86 provides a second translational constraint. During apparatus operation, such a controlled manner and orientation for loading (i.e., receiving) the securing means 12 upon receiving means 16 is easily attained and is further highly repeatable.

Figure 4:
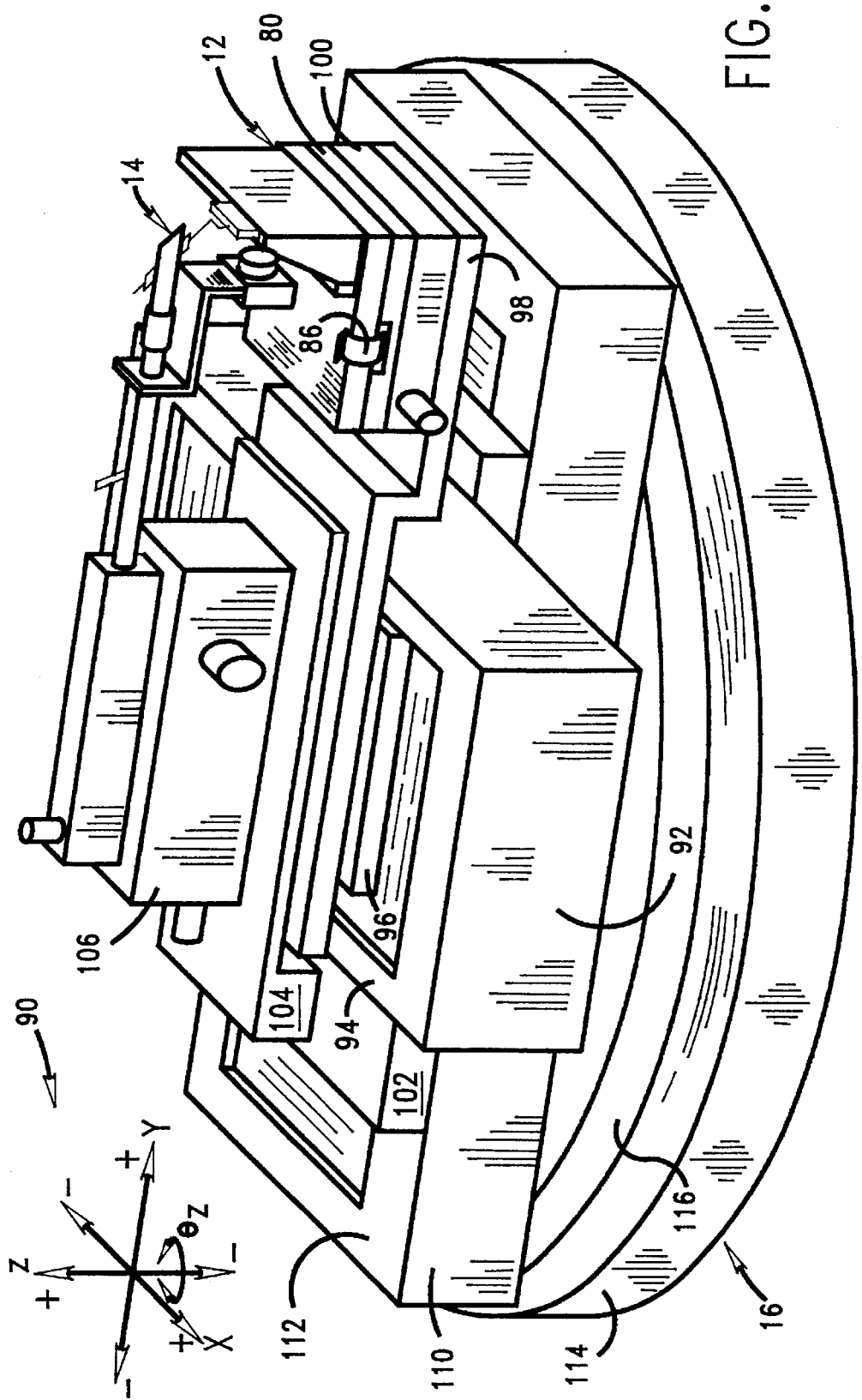
FIG. 4 shows a schematic plan view of the manipulator and the probe of the apparatus according to the present invention.

Turning now to FIG. 4, receiving means 16 comprises a precision mechanical positioning and motion control device for receiving laser bar securing means 12 and probing means 14 in a second and a third manner and orientation, respectively. Receiving means 16 is characterized by a lateral X-axis and a Z-axis frame of reference as indicated by numeral 90 of FIG. 4. Receiving means 16 comprises means for translationally positioning the laser bar securing means 12 and the probing means 14 independently in a fourth and a fifth controlled manner along respective (X, Z) axes, as will be further explained herein below.

Referring still to FIG. 4, receiving means 16 preferably comprises an X-axis translational stage 92, such as a suitable linear translation stage, series UT or MT, which is commercially available from Klinger Scientific of Garden City, N.Y. Linear translation stages are well known in the art and only briefly discussed herein. Translational stage 92 comprises a housing 94 and a movable carriage 96 positioned within the housing 94. That is, carriage 96 is movable within housing 94. A cantilevered support plate 98 having an elongated "Z"-shape as shown in FIG. 4 is suitably connected to the movable carriage 96 of stage 92. Platform 80 of receiving means 16 is connected to the cantilevered portion of support plate 98 via a rotation stage 100, as will be discussed further below. A shown in FIG. 4, the cantilevered portion of support plate 98 is lower than that portion connected to the movable carriage 96, to thereby facilitate a maintaining of a low center of gravity with respect to the X-axis translation stage 92 and further with respect to receiving means 16. Maintaining of a low center of gravity advantageously assists in keeping unwanted vibrations to a minimum during operation of the bar tester apparatus 10. X-axis translational stage 92 further includes a suitable controllable stepper motor or DC servo motor (not shown) for moving movable carriage 96 within housing 94 to thereby enable receiving means 16 to be controllable in the fourth manner for translating the securing means 12 in the X-axis direction to a desired X-axis position.

Receiving means 16 further includes a plate 102 upon which X-axis translational stage 92 is suitably mounted. An "L"-shaped mounting plate 104, oriented lengthwise with the short part of the "L" pointing downwards, is also affixed to and/or suitably mounted upon mounting plate 102 in a manner as shown in FIG. 4.

Upon the "L"-shaped mounting plate 104 is mounted a Z-axis translational stage 106, such as a linear translation stage, series UT or MT, or a vertical translation stage, series UZ, which are commercially available from Klinger Scientific of Garden City, New York. In similarity with the X-axis translational stage, Z-axis translational stage 106 includes a movable carriage (not shown) and a suitable controllable stepper motor or DC servo motor (not shown) for moving the carriage in a controlled manner. Probing means 14 is connected via suitable means (which may include an independent manually adjustable x-y-z positioning means for fine tuning of positioning of probing means 14 upon an initial set-up of probing means 14) to the movable carriage of Z-axis translational stage 106. As a result, receiving means 16 is enabled to be controllable in the fifth manner for translating the probing means 14 in the Z-axis direction to a desired Z-axis position.

As indicated above, platform 80 of receiving means 16 is connected to the cantilevered portion of support plate 98 via a rotation stage 100. Rotation stage 100 can comprise, for example, a suitable rotation stage (TR, UR, or RT series) which is commercially available from Klinger Scientific of Garden City, N.Y. Rotation stage 100 of receiving means 16 provides a means for assuring linear tracking of the probing means 14 with the securing means 12 in the X-axis direction. The rotation stage 100 is characterized by an angular ($\Theta_z$) frame of reference about a Z'-axis, the Z'-axis being parallel to the Z-axis and further being at the center of the rotation stage 100. Securing means 12 is further centered upon stage 100. Rotation stage 100 provides a means for rotationally ($\Theta_z$) positioning the laser bar securing means 12 alone in a seventh controlled manner about the Z'-axis to a desired ($\Theta_z$) angular position, such that, upon a translation of the laser bar securing means 12 in the X-axis direction as controlled by the control means 26 (to be further discussed below), the probing means 14 linearly tracks a substantially similar position of each individual laser device of a laser bar secured in the first manner and orientation to the laser bar securing means 12.

Referring still to FIG. 4, receiving means 16 is further characterized by a lateral (Y-axis) frame of reference as indicated by arrow 90. That is, receiving means 16 further comprises a means 110 for translationally positioning the laser bar securing means 12 and the probing means 14 simultaneously in an eighth controlled manner along the Y-axis. Translational positioning means 110 preferably comprises an Y-axis translational stage, such as a suitable linear translation stage, series UT or MT, which is commercially available from Klinger Scientific of Garden City, N.Y. Translational stage 110 comprises a housing 112 and a movable carriage (not shown) positioned within the housing 112. That is, the carriage of stage 110 is movable within housing 112. Support plate 102 (upon which is mounted securing means 12 and probing means 14 as discussed above) is suitably connected to the movable carriage of stage 110. Stage 110 further includes a suitable controllable stepper motor or DC servo motor (not shown) for moving the carriage thereof in a controlled manner. Receiving means 16 is thus further controllable in the eighth manner for translating the securing means 12 and the probing means 14 simultaneously in the Y-axis direction to a desired Y-axis position.

Referring again still to FIG. 4, receiving means 16 further is characterized by an angular ($\Theta_z$) frame of reference about the Z-axis. Receiving means 16 further comprises a means 114 for rotationally ($\Theta_z$) positioning the laser bar securing means 12 and the probing means 14 in a ninth controlled manner about the Z-axis. Means 114 can comprise, for example, a suitable rotation stage (RT series) which is commercially available from Klinger Scientific of Garden City, N.Y. Rotation stage 114 further includes a movable carriage 116 and a suitable controllable stepper motor or DC servo motor (not shown) for moving the carriage 116 in a controlled manner. Y-axis translational stage 110 is connected via suitable means to movable carriage 116 of rotation stage 114. Receiving means 16 is thus further controllable in the ninth manner for rotating the securing means 12 and the probing means 14 simultaneously along ($\Theta_z$) about the Z-axis to a desired ($\Theta_z$) angular position.

Referring now again to FIG. 1, bar tester apparatus 10 further comprises a means 18 for energizing the probing means 14 in a desired controlled manner. Energizing means 18 may comprise any suitable commercially available, controllable signal or function generator, as appropriate for a desired testing of a laser bar under test. For example, signal generator 18 may include an ability to provide a ramped voltage output signal, such as may be used to breakdown any native oxide which may be present upon an upper surface of the laser device being probed, just prior to energizing the probed laser device for characteristic testing measurements. An output signal line 17 of energizing means 18 is electrically connected to probe needle 60 of probing means 12 via suitable electrical connections.

Referring still to FIG. 1, apparatus 10 further comprises one or more detecting means 19 for detecting a lasing of a probed laser device when a probed laser device is in lasing alignment with one of the detectors. Each of the detecting means provides a characteristic output signal on an output signal line thereof, the output signal being representative of a desired testing characteristic of the probed laser device. Detecting means 19 may comprise one or more detectors 20, 22, and 24 positioned radially about receiving means 16. In an instance in which detecting means 19 comprises a plurality of lasing detectors, each lasing detector can be selected for detecting a particular characteristic of the laser device being tested in accordance with the particular requirements of a testing operation. Respective output signal lines $20_{OUT}$, $22_{OUT}$, and $24_{OUT}$ of detectors 19 are appropriately connected (not shown) to controller 26 for data monitoring, collection, and storage, in accordance with the present invention. Testing characteristics may include power-current traces, threshold current, beam angle, frequency, voltage drop, inconsistency in a laser beam, and single or multimode operation. For instance, detector 20 may comprise a large integrating sphere for use obtaining power-current characteristic information. Detector 22 may comprise a PIN diode (not shown) mounted upon a suitable goniometric cradle 21 (such as commercially available goniometric cradle series GB, from Klinger Scientific, Garden City, N.Y.) for rotation of the PIN diode through an axis of rotation, cradle 21 further which is mounted upon a suitable translation stage 23 (such as commercially available translation stage series UT or MT, from Klinger Scientific, Garden City, N.Y.) for vertical positioning. Detector 22 may be used in conjunction with receiving means 16 for obtaining vertical and horizontal far field laser diode characteristic information. That is, the operability or controlled movement of cradle 21 and stage 23 can be appropriately controlled by controller 26 as is necessary for a particular laser diode testing requirement for achieving a desired movement of detector 22 in conjunction with receiving means 16. Lastly, detector 24 may likewise comprise a small integrating sphere for use in obtaining laser diode frequency characteristic information. Other detectors and/or combinations of detectors may be selected as appropriate for a particular laser diode/laser bar testing requirement.

As indicated above, apparatus 10 (FIG. 1) further includes a means 26 for controlling the receiving means 16 and the energizing means 18 in a controlled manner. Controller 26 may comprise for example, a computer and associated interface circuitry, a suitable programmable control device, or the like, for providing desired control, data acquisition, and data manipulation functions. Preferably, controller 26 comprises a computer and associated interface circuitry, computers and associated interface circuitry being well known in the art and only briefly discussed herein, the computer further being programmed by known techniques for performing desired functions as described herein below.

Controller 26 (FIG. 1) is electrically connected to receiving means 16 via signal lines $26_A$, $26_B$, $26_B$, and $26_D$, respectively, for providing appropriate control signals to stages 92, 106, 110, and 114, respectively, for controlling of the same. A vertically oriented wiring harness 27, attached to support plate 102, is used for securing the signal lines, to include the bar chuck vacuum line, up and away from receiving means 16. Harness 27 advantageously enables a full 360 degree freedom of movement of receiving means 16 for and during operation of laser bar testing apparatus 10, i.e., a full 360 degrees of active measurement area is available for use. In addition, controller 26 is electrically connected to signal generator 18 via signal line $26_E$ for providing an appropriate control signal or signals to signal generator 18 for controlling a desired output of signal generator 18.

Controller 26 further provides appropriate control signals for controlling apparatus 10 in the following manner: (i) in preparation for a testing of a desired one of the laser devices of the laser bar, controlling the receiving means 16 to translate the securing means 12 along the X-axis to an X-axis position for X-axis alignment of a desired one of the laser devices with the probing means 14; (ii) during a testing of a desired one of the laser devices of the laser bar, (ii$_1$) controlling the receiving means 16 to translate the probing means 14 along the Z-axis from a non-contact Z-axis position to a probing contact Z-axis position to thereby probe and electrically contact the corresponding desired one of the laser devices, (ii$_2$) controlling the energizing means 18 to output a desired output signal to thereby energize the probing means 14, wherein the probed laser device is caused to lase, and (ii$_3$) monitor and store the characteristic output signal from a selected detecting means 19; and (iii) upon a completion of the testing of the desired one of the laser devices, controlling the receiving means 16 to translate the probing means 14 along the Z-axis from the probing contact Z-axis position to the non-contact Z-axis position. Controller 26 still further provides appropriate control signals for (iv) prior to a testing of the desired one of the laser devices in conjunction with a selected detecting means 19, controlling the receiving means 16 to translate the securing means 12 and the probing means 14 simultaneously from a retracted home Y-axis position to an extended testing Y-axis position, the extended testing Y-axis position corresponding to a detection measurement distance between the desired one of the laser devices and the selected detecting means 19 during a testing of the desired one of the laser devices, and (v) subsequent to a completion of a testing of the desired one of the laser devices in conjunction with the selected detecting means 19, controlling the receiving means 16 to translate the securing means 12 and the probing means 14 simultaneously from the testing Y-axis position to the home Y-axis position. In addition, controller 26 still further provides appropriate control signals for (vi) prior to a testing of a desired one of the laser devices and while the securing means 12 and the probing means 14 are positioned in the retracted home Y-axis position along the Y-axis, controlling the receiving means 16 to rotate the securing means 16 and the probing means 12 simultaneously along ($\Theta_z$) about the Z-axis to a desired ($\Theta_z$) angular position for establishing a radial alignment of the desired one of the laser devices with a desired one of the plurality of lasing detectors 19. In this later instance, a comprehensive testing of a desired one of the laser devices using apparatus 10 comprises testing the desired one of the laser devices for a variety of testing characteristics utilizing more than one of the plurality of lasing detectors 19. Furthermore, during a comprehensive testing of the desired one of the laser devices, the control means 26, upon placing the probing means 14 in the probing contact Z-axis position, thereafter maintains the probing means 14 in the probing contact Z-axis position for a remainder of the comprehensive testing of the desired one of the laser devices, until such comprehensive testing is completed. In this manner, probing of an individual one of the laser devices of a laser bar is advantageously limited to only being probed once during a testing for a multiplicity of testing characteristics.

Figure 5:
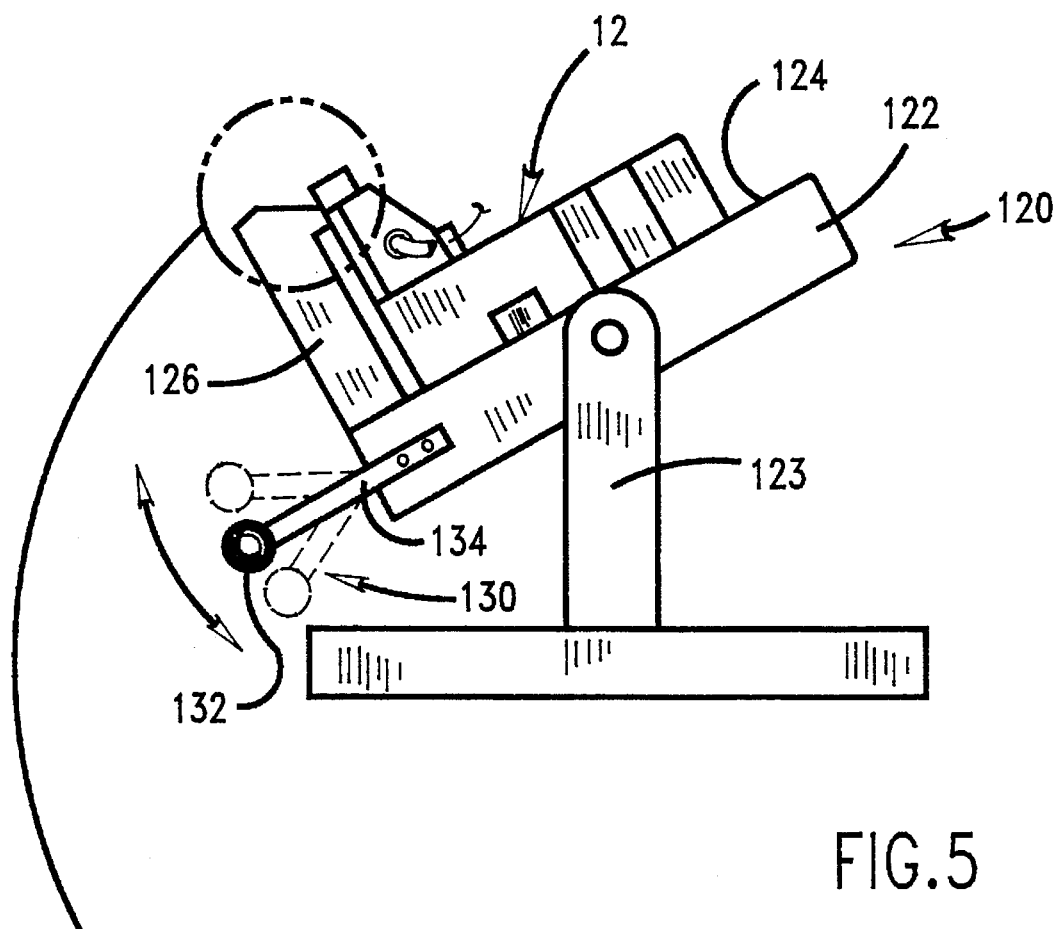
FIG. 5 shows a schematic plan view of the loading station of the apparatus according to the present invention.
Figure 5:
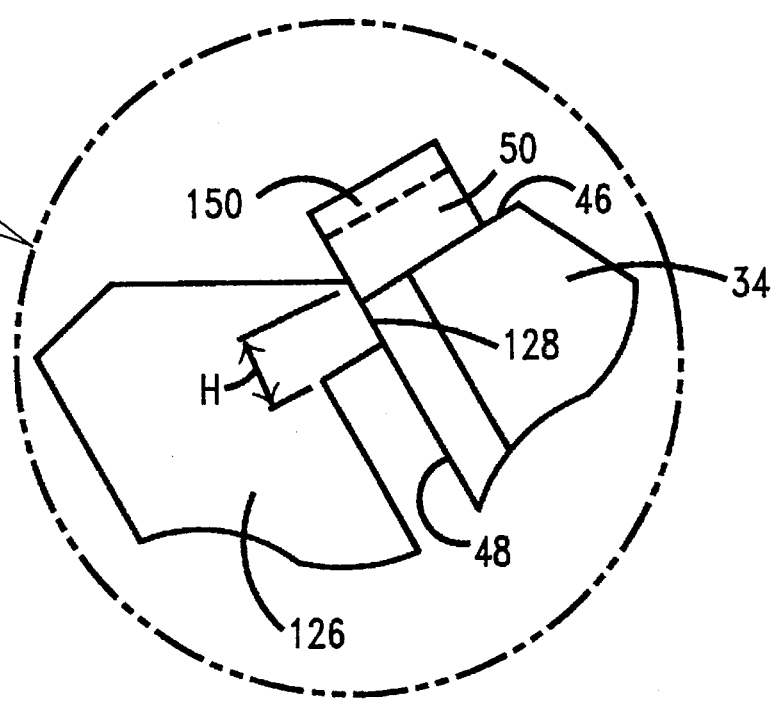

Referring now to FIGS. 1 and 5, bar tester apparatus 10 further comprises a means 120 for use in loading laser bars (only one laser bar 50 is shown) upon the securing means 12. Loading means 120 comprises (i) a platform 122 mounted upon a suitable mechanical mount 123 and further having a top surface 124 oriented at an inclined angle and (ii) a side-edge member 126 suitably attached and further extending above and perpendicular to the platform top surface 124. Side-edge member 126 further comprises a raised datum surface 128 thereon, for abutment with upper portion member 34 of the securing means 12 (proximate the laser bar receiving surface 46) when the securing means 12 is placed upon the platform surface 124 in a manner such that upper portion member 34 is proximate the side-edge member 126. Upper portion member 34 comes in contact with raised datum surface 128 at an area thereof proximate the surface 46 for receiving the laser bar 50. The datum surface 128 comprises a highly polished substantially flat surface. The highly polished datum surface 128 advantageously facilitates easy cleaning thereof and further ensures repeatable gravity self-alignment of laser bars. Datum surface 128 extends above and beyond the upper portion member 34 of securing means 12 by an amount sufficient to engage a front facet surface of the laser bar 50 while at the same time being below an area 150 constituting an active area of the front facet surface of the laser bar 50, when laser bar 50 is positioned upon surface 46. In addition, the overall height dimension "H" of datum surface 128 is kept small with respect to the respective height dimension of side-edge member 126 to facilitate an improved alignment capability. Loading means 120 further advantageously facilitates a gravity self-alignment of the laser bar 50 with the datum surface 128. That is, the front facet surface of the laser bar 50 is automatically self-aligned with a front alignment surface 48 of securing means 12 due to gravity acting upon the laser bar 50 during loading. That is, gravity acts upon individual laser bars to enable the laser bars to substantially effortlessly attain a proper alignment position. Furthermore, during a loading of a laser bar 50 upon securing means 12, the mass of the individual laser bar is the only inertia which the laser bar endures since the laser bar is gravity self-aligned. Thus a minimum of handling of the laser bar is advantageously maintained during a loading and further during a testing thereof.

Referring still to FIG. 5, loading means further includes a means 130 for vibrating the platform 122 to enhance the gravity self-alignment of the laser bar 50 with the datum surface 128. Vibrating means 130 can comprise a suitable weight 132 affixed to an end of a flexible spring member 134, wherein the opposite end of the flexible spring member 134 is affixed to an end of the platform 122 proximate the side-edge member 126. The manually setting of weight 132 and spring member 134 in slight vibratory motion effectively transfers vibration to securing means 12 during a self-aligning of laser bar 50 thereon.

Referring now once again to FIG. 1, a vacuum source 140 is provided for supplying vacuum requirements, such as is required for use by securing means 12 in the securing of one or more laser bars 50 to an uppermost surface 46 thereof. Appropriate flexible vacuum lines 142 of sufficient length and cross-section are provided as necessary. For instance, it is desirable to provide vacuum lines of sufficient length to enable the securing means 12 to be readily moved about apparatus 10, as required during a comprehensive testing of individual ones of the laser devices of the laser bars under test. In addition, vacuum source 140 may provide vacuum as necessary for a vacuum pick-up tool or vacuum tweezers 144 (such as are commercially available from Edmund Scientific Company of Barrington, N.J.), as shown in FIG. 1 resting upon a suitable stand 146. Vacuum pick-up tool 144 may be used for handling of individual laser bars during a loading operation of laser bars upon laser bar securing means 12, to be explained further herein below. Included also, either within vacuum source 140, or external thereto, are appropriate controllable valves (not shown) for selective control of vacuum requirements to the laser bar securing means 12 and the vacuum pick-up tool 144, as appropriate during operation of apparatus 10. Controller 26 provides appropriate vacuum control signals to vacuum source 140 via signal line 148.

In operation, the present invention provides a reliable and repeatable testing apparatus for the testing of individual ones of laser devices of a laser bar, prior to a packaging of the laser devices. Testing of a laser device begins with the loading of the corresponding laser bar or bars to be tested upon securing means 12. As shown in FIG. 2, securing means 12 includes four vacuum ports 52 for securing four laser bars thereto. It should be noted that other sizes of the securing means or laser bar chucks are possible also (e.g., for securing two laser bars, etc.). Securing means 12 is first placed upon loading means 120 (FIGS. 1 and 5) so that the upper portion member 34 of securing means 12 is in contact with datum surface 128. Prior to placing securing means 12 upon platform 122, the uppermost surface 46 of member 34 is preferably cleaned by any suitable cleaning technique, such as with alcohol. In addition, datum surface 128 is likewise preferably cleaned using any suitable cleaning technique, such as with alcohol, prior to a loading operation to minimize any contamination and mis-alignment concerns which could impact a testing operation. As mentioned above, datum surface 128 is a highly polished surface and thus facilitates being easily cleaned. Cleaning of surfaces can thus be easily performed as required in accordance with a particular testing operation. Typically, testing of laser bars using the laser bar tester apparatus 10 is performed within a relatively clean environment, such as a clean room or other suitable environment, as required for the particular testing operation.

In practice, the laser bars to be tested are usually received in some form of container, such as a suitable box or tray, which may also include a pin-grid array of gummy like surfaces. Vacuum tweezers 144 are used to gently lift individual laser bars one at a time from the container and then place the same upon surface 46 of securing means 12. As discussed earlier, the laser bars are gravity self-aligned to the datum surface 128, and thus self-aligned with front facet alignment surface 48 of securing means 12. Alignment of the laser bars may be visually confirmed. Vibrating means 130 can be gently vibrated in a controlled manner, as necessary, to facilitate assisting in the gravity self-alignment of the laser bars. Alignment of the laser bars is thus accomplished without damage to the laser bars, e.g., the active area of the laser bars is not damaged and the integrity of individual laser devices is maintained. In addition, contamination concerns are easily minimized.

During the alignment process, no vacuum is supplied to ports 52. Upon completion of the aligning of all the laser bars, vacuum is applied to ports 52 and thereafter maintained until testing of the laser bars is completed. Vacuum ON/OFF is controlled as appropriate by controller 26. Once vacuum is applied to ports 52, the laser bars remain securely held in place upon securing means 12. Laser bars 50 are thus accurately and efficiently positioned upon the securing means 12. Such positioning of the laser bars upon securing means 12 is also highly repeatable. Furthermore, a certain amount of spacing tolerance is allowable between individual laser bars, which is accounted for, as will be discussed further below. Spacing between laser bars is partially dictated by the spacing between adjacent vacuum ports 52, thus laser bars are nominally spaced during a loading operation.

Prior to the placement of the securing means 12 upon receiving means 16, the X-axis stage 92 is suitably controlled by controller 26 to place platform 98 at a position in the minus-X direction, so as to be out of the way of the probing means 14. In this manner, probing means 14 does not interfere with the loading of securing means 12 upon securing platform 80.

With laser bars 50 accurately aligned and securely held upon securing means 12, securing means 12 may then be manually lifted from the platform 122 of loading means 120 and transferred to the receiving means 16. In particular, securing means 12 is positioned upon securing platform 80 of receiving means 16. As discussed earlier, the V-groove 42 and surface 44 of notch 40 engage with alignment pins 82 and 84, respectively. Alignment pins 82 and 84 provide two of three constraints placed upon securing means 12 when securing means 12 is received by receiving means 16 upon platform 80. Securing clip 86 is then placed in securing contact with reference side edge 36 of securing means 12, whereby the third constraint is placed upon securing means 12. Thus, alignment pins 82 and 84, in conjunction with clip 86, exactly constrain securing means 12 upon receiving means 16 in a controlled manner and orientation. During apparatus operation, therefore, the loading or placing of securing means 12 upon receiving means 16 in a controlled manner and orientation is easily attained and is further highly repeatable. This is one of the essential features to the precision of laser bar tester apparatus 10.

At this point in time, the X-axis stage 92 is controlled by controller 26 for positioning securing means 12 under probing means 14 to a proximate initial default position. Initial default positions of the other stages, as controlled by controller 26, include: the probing means 14 being in a non-contact probing position (i.e., a position in the plus-Z direction); the Y-axis stage being in a retracted home position (i.e., a position in the minus-Y direction); and rotation stage 114 in a home position (for example, positioned as shown in FIG. 1). Other initial default positions may be used as appropriate for a particular testing operation.

Upon the securing means 12 being placed in the initial default position under probing means 14, receiving means 16 is then controlled by controller 26 to rotationally position the laser bar securing means 12 and probing means 14 in a direction indicated by the arrow identified by numeral 150 as shown in FIG. 1. That is, rotation stage 114 is controlled to rotate until the desired angular position is achieved. At this point, controller 26 controls stage 110 to extend the securing means 12 and probing means 14 in the plus-Y direction to an extended Y-axis position. While in this extended Y-axis position, the probing means 14 is manually adjusted to be positioned over a contact point of the first laser device of the first laser bar. A suitable microscope (100–300X) (not shown) mounted upon a movable stage (not shown), which can swing in and out of place over the table 28, is used for visually monitoring the adjustment of probing means 14 for alignment with the first laser device of the first laser bar.

At this time, for greater understanding of the operation of the present invention, it should be noted that different types of laser bars may be tested, the different types of laser bars having various distinct device characteristics such as laser bar length, width, laser device cavity length, spacing between individual laser devices on the laser bar, etc. To facilitate an ability to test a number of different types of laser bars, profiles can be established for the respective laser bar types being tested. Such profiles may also be stored by controller 26 for use by controller 26 during a testing of a particular type of laser bar. It will thus be necessary to select the appropriate profile information before beginning a testing operation.

For the testing operation currently being discussed, the laser bar profile corresponding to the particular type of laser bar being tested, is appropriately selected using controller 26. Controller 26 then uses the laser bar profile information as appropriate to control the operation of apparatus 10 for the testing of the particular type of laser bar under test. Apparatus 10 may thus be customized for testing any number of different types of laser bars.

Referring again to the alignment of probing needle 60 of probing means 14 with the first laser device of the first laser bar mounted upon securing means 12, controller 26 then utilizes the characteristic information (such as the number of laser devices per laser bar and the length of the laser bar as obtained from the particular laser bar profile) to advance the securing means 12 in the plus-X direction for placing the first device of the second laser bar approximately under the probing needle 60 of the probing means 14. A suitable adjustment may be made for registering the first laser device of the second laser bar under probing needle 60, such an adjustment being stored by controller 26 for use during the testing operation. The same procedure is carried out for the remainder of the laser bars, i.e, registering the first laser device thereof with the probing needle. Thus, some amount of tolerance in the spacing between laser bars is permissible, since controller 26, via the registration and profile information, may suitably thereafter control the X-axis stage 92 to index securing means 12 under probing means 14 in preparation for probing each laser device of each laser bar as needed.

Linear tracking of the securing means 12 under probing means 14 in the X-axis direction may then be suitably adjusted using rotation stage 100. While under the view of a microscope (not shown, however as discussed above), the securing means 12 may be moved under the probe needle 60 of probing means 14 in a controlled manner, as directed by controller 26, from the first to the last laser device of the first laser bar or from the first laser bar to the last laser bar, and an appropriate adjustment to the angular position of securing means 12 may be made using rotation stage 100. Such an adjustment ensures that probing means linearly tracks a substantially similar position of each individual laser device of the laser bars which are secured in the first manner and orientation upon securing means 12.

Upon a completion of an initial registration and adjustment of linear tracking of the securing means 12 with the probing means 14 as discussed above, apparatus 10 is ready to continue a testing of a desired one or ones of the laser devices of the laser bars secured upon securing means 12. In particular, controller 26 controls receiving means 16 and energizing means 18 in the following manner with respect to obtaining a characteristic output signal from a selected detector 19: (i) in preparation for a testing of a desired one of the laser devices of the laser bar, controlling the receiving means 16 to translate the securing means 12 along the X-axis to an X-axis position for X-axis alignment of the desired one of the laser devices with the probing needle 66 of probing means 14; (ii) during a testing of a desired one of the laser devices of the laser bar, (ii$_1$) controlling receiving means 16 to translate the probing means 14 along the Z-axis from a non-contact Z-axis position to a probing contact Z-axis position to thereby probe and electrically contact the corresponding desired one of the laser devices, (ii$_2$) controlling energizing means 18 to energize probing means 14 in a controlled manner in accordance with the particular requirements of the testing of the laser device for obtaining the desired characteristic information, wherein the probed laser device is caused to lase, and (ii$_3$) monitor and store the characteristic output signal from the selected detecting means 19; and (iii) upon a completion of the testing of the desired one of the laser devices, controlling receiving means 16 to translate probing means 14 along the Z-axis from the probing contact Z-axis position to the non-contact Z-axis position.

Controller 26 further controls receiving means 16 and energizing means 18 for (iv) prior to a testing of the desired one of the laser devices in conjunction with a selected detecting means 19, controlling the receiving means 16 to translate the securing means 12 and the probing means 14 simultaneously from a retracted home Y-axis position to an extended testing Y-axis position, the extended testing Y-axis position corresponding to a detection measurement distance between the desired one of the laser devices and the selected detecting means 19 during a testing of the desired one of the laser devices, and (v) subsequent to a completion of a testing of the desired one of the laser devices in conjunction with the selected detecting means 19, controlling the receiving means 16 to translate the securing means 12 and the probing means 14 simultaneously from the testing Y-axis position to the home Y-axis position. In addition, controller 26 still further controls receiving means 16 and energizing means 18 for (vi) prior to a testing of a desired one of the laser devices and while the securing means 12 and the probing means 14 are positioned in the retracted home Y-axis position along the Y-axis, controlling the receiving means 16 to rotate the securing means 12 and the probing means 14 simultaneously along ($\Theta_z$) about the Z-axis to a desired ($\Theta_z$) angular position for establishing a radial alignment of the desired one of the laser devices with a desired one of the plurality of lasing detectors 19. In this later instance, a comprehensive testing of a desired one of the laser devices using apparatus 10 comprises testing the desired one of the laser devices for a variety of testing characteristics utilizing more than one of the plurality of lasing detectors 19. Furthermore, during a comprehensive testing of the desired one of the laser devices, the control means 26, upon placing the probing means 14 in the probing contact Z-axis position, thereafter maintains the probing means 14 in the probing contact Z-axis position for a remainder of the comprehensive testing of the desired one of the laser devices, until such comprehensive testing is completed. In this manner, probing of an individual one of the laser devices of a laser bar is advantageously limited to only being probed once during a testing for a multiplicity of testing characteristics. The remainder of the laser devices of the laser bars may be similarly tested. That is, controller 26 can control receiving means 16 and energizing means 18 to test, in a prescribed order, more than one of the laser devices of the laser bar or bars.

The present invention thus advantageously provides a novel laser bar testing apparatus which is capable of high testing throughput for use in a high volume manufacturing environment. Such a testing apparatus provides real-time testing capability for the characterization and functional determination of laser devices at a laser bar level. Handling and damage to individual laser devices of laser bars under test are minimized. Furthermore, a variety of testing characteristics may be monitored and stored, as necessary, for the requirements of a particular testing application. For instance, upon the monitoring or detection of a faulty testing characteristic of a laser device under test (i.e., rendering the same as being non-functional), such a laser device can be "tagged" by suitable means, such as by non-contamination inking of the defective device, to identify the same. Identification of non-functional laser diodes enables such non-functional devices to be separated out, thereby eliminating any unwanted packaging of non-functional devices. Various types of other testing characteristics of the laser devices may also be tested and monitored to separate and/or characterize groups of laser bars/laser devices by categories (e.g., quality, life time, etc.). For instance, controller 26 may control thermoelectric temperature element 51, as necessary, for temperature stressing the particular laser diode under test during a high temperature characterization of the same. Such high temperature characterization may be useful for establishing a lifetime estimate of the particular laser device being tested.

While the invention has been particularly shown and described with reference to the preferred embodiment thereof, it will be understood by those skilled in the art that various changes in form and detail may be made therein without departing from the spirit and scope of the invention. For instance, more than one securing means or laser bar chucks 12 may be utilized with apparatus 10. That is, one fully loaded bar chuck can be mounted upon receiving means 16 for the testing of respective laser devices, while the a second laser bar chuck is being loaded with laser bars in preparation for testing of the same. This further exemplifies the increased testing through-put afforded by the apparatus 10 of the present invention. Idle time is minimized, thereby making apparatus 10 further suitable for a high volume manufacturing environment.

What is claimed is:

1. An apparatus for testing individual ones of semiconductor laser devices of a laser bar during a manufacturing thereof, the semiconductor laser devices being in a form at a laser bar level, said apparatus comprising:

a) means for securing the laser bar in a first manner and orientation, wherein said laser bar securing means comprises a laser bar chuck, the laser bar chuck comprising (i) a base member having a first thermal conductivity, and (ii) an upper portion member having an uppermost surface and a front facet alignment reference surface, wherein the uppermost surface constitutes a laser bar receiving surface and wherein the front facet alignment reference surface is perpendicular to the laser bar receiving surface and provides a reference surface for use in the alignment of a front facet surface of the laser bar therewith, the upper portion member further having a second thermal conductivity, the second thermal conductivity being greater than the first thermal conductivity, the upper portion member still further characterized by a vacuum port for securing the laser bar to the receiving surface upon application of a vacuum source at the vacuum port;

b) means for probing a laser device of the laser bar;

c) means for receiving said laser bar securing means and said probing means in a second and third manner and orientation, respectively, said receiving means characterized by a lateral (X-axis, Z-axis) frame of reference, said receiving means further comprising means for translationally positioning said laser bar securing means and said probing means independently in a fourth and fifth controlled manner along respective (X, Z) axes, wherein said receiving means is controllable in the fourth manner for translating said securing means in the X-axis direction to a desired X-axis position, and said receiving means is further controllable in the fifth manner for translating said probing means in the Z-axis direction to a desired Z-axis position;

d) means for energizing said probing means in a sixth controlled manner;

e) means for detecting a lasing of a probed laser device, said detecting means providing a characteristic output signal representative of a testing characteristic of the probed laser device; and f) means for controlling said receiving means and said energizing means in the following manner: (i) in preparation for a testing of a desired one of the laser devices of the laser bar, controlling said receiving means to translate said securing means along the X-axis to an X-axis position for X-axis alignment of the desired one of the laser devices with said probing means; (ii) during a testing of a desired one of the laser devices of the laser bar, (ii$_1$) controlling said receiving means to translate said probing means along the Z-axis from a non-contact Z-axis position to a probing contact Z-axis position to thereby probe and electrically contact the corresponding desired one of the laser devices, (ii$_2$) controlling said energizing means to energize said probing means in the sixth controlled manner, wherein the probed laser device is caused to lase, and (ii$_3$) monitor and store the characteristic output signal from said detecting means; and (iii) upon a completion of the testing of the desired one of the laser devices, controlling said receiving means to translate said probing means along the Z-axis from the probing contact Z-axis position to the non-contact Z-axis position.

2. The apparatus of claim 1, wherein
   said control means further for controlling said receiving means and said energizing means to test, in a prescribed order, more than one of the laser devices of the laser bar.

3. The apparatus of claim 1, wherein the upper portion member of the laser bar chuck of said laser bar securing means is further provided with at least one vacuum port per laser bar, as necessary for a particular testing application, for securing more than one laser bar to the laser bar receiving surface.

4. The apparatus of claim 1, wherein said laser bar securing means further comprises a means for controlling a temperature of the upper portion member, said temperature control means enabling a controlled temperature stressing of the laser diode during a testing thereof.

5. The apparatus of claim 1, wherein the base member of said laser bar securing means is further characterized by four side edges, wherein one side edge is a reference side edge and an opposite side edge includes a notch and a V-groove, the notch having a surface thereof parallel to the respective side edge and for defining and providing a rotational constraint, the V-groove spaced from the notch and for defining and providing a first translational constraint;

said receiving means further having two alignment pins and a securing clip, the alignment pins for engaging the notch and V-groove, respectively, of base member of said laser bar securing means when said laser bar securing means is received upon said receiving means, the securing clip for engaging the base member of said laser bar securing means at the reference side edge thereof, the securing clip for providing a second translational constraint, thereby exactly constraining said securing means upon said receiving means in the second manner and orientation.

6. The apparatus of claim 1, wherein
   said probing means comprises a flexible conductive probe needle attached, via an electrical insulator, to an end of a probe shaft, the probe shaft being connected to said receiving means, the flexible conductive probe needle further having a curved shape for enabling flexure thereof, the flexible conductive probe needle avoiding a scratching of an upper surface of the laser bar upon a pressure contact with the upper surface of the laser bar; and further wherein
   said receiving means places a prescribed controlled force upon the laser device being probed by driving the probing means in the Z-axis direction a prescribed amount beyond a "just touching" contact condition, the "just touching" contact condition corresponding to a condition at which a tip of the probe needle just touches an uppermost surface of the laser device being probed.

7. The apparatus of claim 6, further comprising a rear facet detector, the rear facet detector attached to the probe shaft and oriented for detection of a lasing of a probed laser device from a rear facet thereof.

8. The apparatus of claim 1, wherein said receiving means further comprises means for assuring linear tracking of the probing means with the securing means in the X-axis direction, said linear tracking assuring means characterized by an angular ($\Theta_{z'}$) frame of reference about a Z'-axis, the Z'-axis being parallel to the Z-axis, said linear tracking assuring means further comprising a means for rotationally ($\Theta_{z'}$) positioning said laser bar securing means alone in a seventh controlled manner about the Z'-axis to a desired ($\Theta_{z'}$) angular position, such that, upon a translation of said laser bar securing means in the X-axis direction as controlled by said control means, said probing means linearly tracks a substantially similar position of each individual laser device of a laser bar secured in the first manner and orientation to the laser bar securing means.

9. The apparatus of claim 1, further comprising:

g) means for loading the laser bar upon said securing means, said loading means comprising (i) a platform having a surface oriented at an inclined angle and (ii) a side-edge member suitably attached and extending above and perpendicular to said platform surface, the side-edge member further having a raised datum surface thereon for abutment with an upper portion of said securing means when said securing means is placed upon the platform surface, the upper portion of said securing means corresponding to an area thereof for receiving the laser bar, the datum surface extending above and beyond the upper portion of said securing means by an amount sufficient to engage a front facet surface of the laser bar while at the same time being below an area constituting an active area of the front facet surface of the laser bar, said loading means facilitating a gravity self-alignment of the laser bar with the datum surface, whereby the front facet surface of the laser bar is self-aligned with a front surface of said securing means.

10. The apparatus of claim 9, wherein said loading means further includes a means for vibrating the platform to enhance the gravity self-alignment of the laser bar with the datum surface, said vibrating means comprising a weight affixed to an end of a spring member, wherein the opposite end of the spring member is affixed to an end of the platform surface proximate the side-edge member.

11. The apparatus of claim 1, wherein said receiving means is further characterized by a lateral (Y-axis) frame of reference, said receiving means further comprising means for translationally positioning said laser bar securing means and said probing means simultaneously in an eighth controlled manner along the Y-axis, wherein said receiving means is further controllable in the eighth manner for translating said securing means and said probing means simultaneously in the Y-axis direction to a desired Y-axis position, and wherein said control means further for (iv) prior to a testing of the desired one of the laser devices in conjunction with said detecting means, controlling said receiving means to translate said securing means and said probing means simultaneously from a retracted home Y-axis position to an extended testing Y-axis position, the extended testing Y-axis position corresponding to a detection measurement distance between the desired one of the laser devices and said detecting means during a testing of the desired one of the laser devices, and (v) subsequent to a completion of a testing of the desired one of the laser devices in conjunction with said detecting means, controlling said receiving means to translate said securing means and said probing means simultaneously from the testing Y-axis position to the home Y-axis position.

12. The apparatus of claim 11, further wherein said receiving means is further characterized by an angular ($\Theta_z$) frame of reference, said receiving means further comprising means for rotationally ($\Theta_z$) positioning said laser bar securing means and said probing means in a ninth controlled manner about the Z-axis, wherein said receiving means is further controllable in the ninth manner for rotating said securing means and said probing means simultaneously along ($\Theta_z$) about the Z-axis to a desired ($\Theta_z$) angular position, and said detecting means further comprises a plurality of lasing detectors, each lasing detector for detecting a particular characteristic of the laser device being tested, said plurality of lasing detectors further being positioned radially about said receiving means;

wherein said control means still further for (vi) prior to a testing of a desired one of the laser devices and while said securing means and said probing means are positioned in the retracted home Y-axis position along the Y-axis, controlling said receiving means to rotate said securing means and said probing means simultaneously along ($\Theta_z$) about the Z-axis to a desired ($\Theta_z$) angular position for establishing a radial alignment of the desired one of the laser devices with a desired one of said plurality of lasing detectors, said apparatus further wherein a comprehensive testing of a desired one of the laser devices comprises testing the desired one of the laser devices for a variety of testing characteristics utilizing more than one of said plurality of lasing detectors, and furthermore, wherein said control means, upon placing said probing means in the probing contact Z-axis position, thereafter maintains said probing means in the probing contact Z-axis position for a remainder of the comprehensive testing of the desired one of the laser devices, until such comprehensive testing is completed.

13. The apparatus of claim 12, wherein said control means further for controlling said receiving means and said energizing means to test, in a prescribed order, more than one of the laser devices of the laser bar.

14. The apparatus of claim 12, wherein the upper portion member of the laser bar chuck of said laser bar securing means is further provided with at least one vacuum port per laser bar, as necessary for a particular testing application, for securing more than one laser bar to the laser bar receiving surface.

15. The apparatus of claim 12, wherein said laser bar securing means further comprises a means for controlling a temperature of the upper portion member, said temperature control means enabling a controlled temperature stressing of the laser diode during a testing thereof.

16. The apparatus of claim 12, wherein the base member of said laser bar securing means is further characterized by four side edges, wherein one side edge is a reference side edge and an opposite side edge includes a notch and a V-groove, the notch having a surface thereof parallel to the respective side edge and for defining and providing a rotational constraint, the V-groove spaced from the notch and for defining and providing a first translational constraint;

said receiving means further having two alignment pins and a securing clip, the alignment pins for engaging the notch and V-groove, respectively, of base member of said laser bar securing means when said laser bar securing means is received upon said receiving means, the securing clip for engaging the base member of said laser bar securing means at the reference side edge thereof, the securing clip for providing a second translational constraint, thereby exactly constraining said securing means upon said receiving means in the second manner and orientation.

17. The apparatus of claim 12, wherein said probing means comprises a flexible conductive probe needle attached, via an electrical insulator, to an end of a probe shaft, the probe shaft being connected to said receiving means, the flexible conductive probe needle further having a curved shape for enabling flexure thereof, the flexible conductive probe needle avoiding a scratching of an upper surface of the laser bar upon a pressure contact with the upper surface of the laser bar; and further wherein said receiving means places a prescribed controlled force upon the laser device being probed by driving the probing means in the Z-axis direction a prescribed amount beyond a "just touching" contact condition, the "just touching" contact condition corresponding to a condition at which a tip of the probe needle just touches an uppermost surface of the laser device being probed.

18. The apparatus of claim 17, further comprising a rear facet detector, the rear facet detector attached to the probe shaft and oriented for detection of a lasing of a probed laser device from a rear facet thereof.

19. The apparatus of claim 12, wherein said receiving means further comprises means for assuring linear tracking of the probing means with the securing means in the X-axis direction, said linear tracking assuring means characterized by an angular ($\Theta_{z'}$) frame of reference about a Z'-axis, the Z'-axis being parallel to the Z-axis, said linear tracking assuring means further comprising a means for rotationally ($\Theta_{z'}$) positioning said laser bar securing means alone in a seventh controlled manner about the Z'-axis to a desired ($\Theta_{z'}$) angular position, such that, upon a translation of said laser bar securing means in the X-axis direction as controlled by said control means, said probing means linearly tracks a substantially similar position of each individual laser device of a laser bar secured in the first manner and orientation to the laser bar securing means.

20. The apparatus of claim 12, further comprising:

g) means for loading the laser bar upon said securing means, said loading means comprising (i) a platform having a surface oriented at an inclined angle and (ii) a side-edge member suitably attached and extending above and perpendicular to said platform surface, the side-edge member further having a raised datum surface thereon for abutment with an upper portion of said securing means when said securing means is placed upon the platform surface, the upper portion of said securing means corresponding to an area thereof for receiving the laser bar, the datum surface extending above and beyond the upper portion of said securing means by an amount sufficient to engage a front facet surface of the laser bar while at the same time being below an area constituting an active area of the front facet surface of the laser bar, said loading means facilitating a gravity self-alignment of the laser bar with the datum surface, whereby the front facet surface of the laser bar is self-aligned with a front surface of said securing means.

21. The apparatus of claim 20, wherein said loading means further includes a means for vibrating the platform to enhance the gravity self-alignment of the laser bar with the datum surface, said vibrating means comprising a weight affixed to an end of a spring member, wherein the opposite end of the spring member is affixed to an end of the platform proximate the side-edge member.

22. An apparatus for testing individual ones of semiconductor laser devices of a laser bar during a manufacturing thereof, the semiconductor laser devices being in a form at a laser bar level, said apparatus comprising:

a) means for securing the laser bar in a first manner and orientation, wherein said laser bar securing means comprises a laser bar chuck, the laser bar chuck comprising (i) a base member having a first thermal conductivity, and (ii) an upper portion member having an uppermost surface and a front facet alignment reference surface, wherein the uppermost surface constitutes a laser bar receiving surface and wherein the front facet alignment reference surface is perpendicular to the laser bar receiving surface and provides a reference surface for use in the alignment of a front facet surface of the laser bar therewith, the upper portion member further having a second thermal conductivity, the second thermal conductivity being greater than the first thermal conductivity, the upper portion member still further characterized by a vacuum port for securing the laser bar to the receiving surface upon application of a vacuum source at the vacuum port;

b) means for probing a laser device of the laser bar, wherein said probing means comprises a flexible conductive probe needle attached, via an electrical insulator, to an end of a probe shaft, the flexible conductive probe needle further having a curved shape for enabling flexure thereof, the flexible conductive probe needle avoiding a scratching of an upper surface of the laser bar upon a pressure contact with the upper surface of the laser bar;

c) means for receiving said laser bar securing means and said probing means in a second and third manner and orientation, respectively, said receiving means characterized by a lateral (X-axis, Z-axis) frame of reference, said receiving means further comprising means for translationally positioning said laser bar securing means and said probing means independently in a fourth and fifth controlled manner along respective (X, Z) axes, wherein said receiving means is controllable in the fourth manner for translating said securing means in the X-axis direction to a desired X-axis position, and said receiving means is further controllable in the fifth manner for translating said probing means in the Z-axis direction to a desired Z-axis position, wherein the probe shaft of said probing means is connected to said receiving means, wherein said receiving means further comprises means for assuring linear tracking of the probing means with the securing means in the X-axis direction, said linear tracking assuring means characterized by an angular ($\Theta z'$) frame of reference about a Z'-axis, the Z'-axis being parallel to the Z-axis, said linear tracking assuring means further comprising a means for rotationally ($\Theta_{z'}$) positioning said laser bar securing means alone in a sixth controlled manner about the Z'-axis to a desired ($\Theta_{z'}$) angular position, such that, upon a translation of said laser bar securing means in the X-axis direction, said probing means linearly tracks a substantially similar position of each individual laser device of a laser bar secured in the first manner and orientation to the laser bar securing means;

d) means for energizing said probing means in a seventh controlled manner;

e) means for detecting a lasing of a probed laser device, said detecting means providing a characteristic output signal representative of a testing characteristic of the probed laser device; and f) means for controlling said receiving means and said energizing means in the following manner: (i) in preparation for a testing of a desired one of the laser devices of the laser bar, controlling said receiving means to translate said securing means along the X-axis to an X-axis position for X-axis alignment of the desired one of the laser devices with said probing means; (ii) during a testing of a desired one of the laser devices of the laser bar, ($ii_1$) controlling said receiving means to translate said probing means along the Z-axis from a non-contact Z-axis position to a probing contact Z-axis position to thereby probe and electrically contact the corresponding desired one of the laser devices, ($ii_2$) controlling said energizing means to energize said probing means in the seventh controlled manner, wherein the probed laser device is caused to lase, and ($ii_3$) monitor and store the characteristic output signal from said detecting means; and (iii) upon a completion of the testing of the desired one of the laser devices, controlling said receiving means to translate said probing means along the Z-axis from the probing contact Z-axis position to the non-contact Z-axis position; and g) means for loading the laser bar upon said securing means, said loading means comprising (i) a platform having a surface oriented at an inclined angle and (ii) a side-edge member suitably attached and extending above and perpendicular to said platform surface, the side-edge member further having a raised datum surface thereon for abutment with an upper portion of said securing means when said securing means is placed upon the platform surface, the upper portion of said securing means corresponding to an area thereof for receiving the laser bar, the datum surface extending above and beyond the upper portion of said securing means by an amount sufficient to engage a front facet surface of the laser bar while at the same time being below an area constituting an active area of the front facet surface of the laser bar, said loading means facilitating a gravity self-alignment of the laser bar with the datum surface, whereby the front facet surface of the laser bar is self-aligned with a front surface of said securing means.

23. The apparatus of claim 22, wherein said control means further for controlling said receiving means and said energizing means to test, in a prescribed order, more than one of the laser devices of the laser bar.

24. The apparatus of claim 22, wherein the upper portion member of the laser bar chuck of said laser bar securing means is further provided with at least one vacuum port per laser bar, as necessary for a particular testing application, for securing more than one laser bar to the laser bar receiving surface.

25. The apparatus of claim 22, wherein said laser bar securing means further comprises a means for controlling a temperature of the upper portion member, said temperature control means enabling a controlled temperature stressing of the laser diode during a testing thereof.

26. The apparatus of claim 22, wherein the base member of said laser bar securing means is further characterized by four side edges, wherein one side edge is a reference side edge and an opposite side edge includes a notch and a V-groove, the notch having a surface thereof parallel to the respective side edge and for defining and providing a rotational constraint, the V-groove spaced from the notch and for defining and providing a first translational constraint; said receiving means further having two alignment pins and a securing clip, the alignment pins for engaging the notch and V-groove, respectively, of base member of said laser bar securing means when said laser bar securing means is received upon said receiving means, the securing clip for engaging the base member of said laser bar securing means at the reference side edge thereof, the securing clip for providing a second translational constraint, thereby exactly constraining said securing means upon said receiving means in the second manner and orientation.

27. The apparatus of claim 22, further comprising a rear facet detector, the rear facet detector attached to the probe shaft and oriented for detection of a lasing of a probed laser device from a rear facet thereof.

28. The apparatus of claim 22, wherein said loading means further includes a means for vibrating the platform to enhance the gravity self-alignment of the laser bar with the datum surface, said vibrating means comprising a weight affixed to an end of a spring member, wherein the opposite end of the spring member is affixed to an end of the platform proximate the side-edge member.

29. The apparatus of claim 22, wherein said receiving means is further characterized by a lateral (Y-axis) frame of reference, said receiving means further comprising means for translationally positioning said laser bar securing means and said probing means simultaneously in an eighth controlled manner along the Y-axis, wherein said receiving means is further controllable in the eighth manner for translating said securing means and said probing means simultaneously in the Y-axis direction to a desired Y-axis position, and wherein said control means further for (iv) prior to a testing of the desired one of the laser devices in conjunction with said detecting means, controlling said receiving means to translate said securing means and said probing means simultaneously from a retracted home Y-axis position to an extended testing Y-axis position, the extended testing Y-axis position corresponding to a detection measurement distance between the desired one of the laser devices and said detecting means during a testing of the desired one of the laser devices, and (v) subsequent to a completion of a testing of the desired one of the laser devices in conjunction with said detecting means, controlling said receiving means to translate said securing means and said probing means simultaneously from the testing Y-axis position to the home Y-axis position, further wherein said receiving means is further characterized by an angular ($\Theta_z$) frame of reference, said receiving means further comprising means for rotationally ($\Theta_z$) positioning said laser bar securing means and said probing means in a ninth controlled manner about the Z-axis, wherein said receiving means is further controllable in the ninth manner for rotating said securing means and said probing means simultaneously along ($\Theta_z$) about the Z-axis to a desired ($\Theta_z$) angular position, and said detecting means further comprises a plurality of lasing detectors, each lasing detector for detecting a particular characteristic of the laser device being tested, said plurality of lasing detectors further being positioned radially about said receiving means;

wherein said control means still further for (vi) prior to a testing of a desired one of the laser devices and while said securing means and said probing means are positioned in the retracted home Y-axis position along the Y-axis, controlling said receiving means to rotate said securing means and said probing means simultaneously along ($\Theta_z$) about the Z-axis to a desired ($\Theta_z$) angular position for establishing a radial alignment of the desired one of the laser devices with a desired one of said plurality of lasing detectors, said apparatus further wherein a comprehensive testing of a desired one of the laser devices comprises testing the desired one of the laser devices for a variety of testing characteristics utilizing more than one of said plurality of lasing detectors, and furthermore, wherein said control means, upon placing said probing means in the probing contact Z-axis position, thereafter maintains said probing means in the probing contact Z-axis position for a remainder of the comprehensive testing of the desired one of the laser devices, until such comprehensive testing is completed.

* * * * *